United States Patent [19]

Watabe et al.

[11] 4,196,387

[45] Apr. 1, 1980

[54] APPARATUS FOR MEASURING OUTPUT DC CURRENT OF RECTIFIER DEVICES

[75] Inventors: Isao Watabe, Higashiyamato; Hideki Mizuno, Tokyo, both of Japan

[73] Assignee: Tokyo Shibaura Denki Kabushiki Kaisha, Kanagawa, Japan

[21] Appl. No.: 897,207

[22] Filed: Apr. 17, 1978

[51] Int. Cl.² ............... G01R 19/00; G01R 19/18
[52] U.S. Cl. ........................... 324/107; 324/119; 324/127; 363/126; 363/156
[58] Field of Search ............ 324/107, 119, 127, 142; 363/126, 129, 153, 156

[56] References Cited

U.S. PATENT DOCUMENTS 3,944,919  3/1976  Jewell et al. ................... 324/107

OTHER PUBLICATIONS

Bingham et al., "A New Technique . . .", Conference Paper AIEE, Winter Meeting, Jan. 28–Feb. 2, 1962.

Primary Examiner—Rudolph V. Rolinec
Assistant Examiner—Ernest F. Karlsen
Attorney, Agent, or Firm—Stevens, Davis, Miller & Mosher

[57] ABSTRACT

In apparatus for indirectly measuring the output DC current of a rectifier device on the input side of a polyphase rectifier transformer, a polyphase auxiliary current transformer is provided and the polyphase primary or secondary windings thereof are combined such that the area of the decreasing secondary current waveform is made equal to the area of the increasing secondary current waveform during commutation thereby releaving the secondary current from the adverse effect of the overlap angle.

2 Claims, 7 Drawing Figures

$I_2 = K_3 \cdot I_1$

APPARATUS FOR MEASURING OUTPUT DC CURRENT OF RECTIFIER DEVICES

BACKGROUND OF THE INVENTION

This invention relates to apparatus for measuring the DC output current of a polyphase rectifying device on the AC side.

In a conventional method of measuring the output current of a rectifying device on the AC side, the secondary currents of bushing current transformers BCT connected to the primary side of a polyphase rectifier transformer T is directly rectified by a measuring rectifier $RF_2$ or through an auxiliary current transformer CT, as shown in FIG. 1, and the output DC current $I_2$ of the measuring rectifier $RF_2$ is measured by a DC ammeter $A_{DC}$ thus indirectly measuring the output current $I_1$ of the main rectifier $RF_1$. Where a phase shift winding is provided for the rectifier transformer T, due to the effect of the transformer reactance the waveform of the output current $I_2$ of the measuring rectifier drops at an interval of 60° as shown in FIG. 3 with the result that a definite proportional relationship would not be established between the output current $I_1$ to be measured and the output current $I_2$ of the measuring rectifier $RF_2$. The extent of drop of the rectifier output varies depending upon the overlap angle u during communication and the degree of phase shift and affects the proportionality constant between $I_1$ and $I_2$. In this case, if the value of the current indicated by ammeter $A_{DC}$ is corrected to the true value at the rated current, error of about 10% would be resulted at portions other than those where current drop occurs. For this reason, it is necessary to use a calibration curve for respective points or to use a DC ammeter having a calibrated nonuniform scale.

SUMMARY OF THE INVENTION

An object of this invention is the provisional an improved apparatus for accurately measuring the output current of a rectifier device without being affected by the overlap angle of the rectifier transformer during commutation.

According to this invention there is provided apparatus for measuring the output DC current of a polyphase rectifier device of the type wherein the output DC is indirectly measured on the input side of a polyphase rectifier transformer provided with a phase shift winding through current transformer means and a measuring rectifier, wherein there are provided polyphase auxiliary current transformer means having polyphase windings and connected between the current transformer means and the measuring rectifier and means to combine the polyphase windings so as to produce secondary alternating current having a waveform not affected by the overlap angle of the rectifier device during commutation.

More particularly the polyphase windings on the primary or secondary side of the auxiliary current transformer means are combined such that the area of the decreasing secondary current waveform and the area of the increasing secondary current waveforms during commutation are made to be equal.

BRIEF DESCRIPTION OF THE DRAWINGS

Further objects and advantages of the invention will be more fully understood from the following detailed description taken in conjunction with the accompanying drawings in which.

DESCRIPTION OF THE PREFERRED EMBODIMENT

Figure 1:
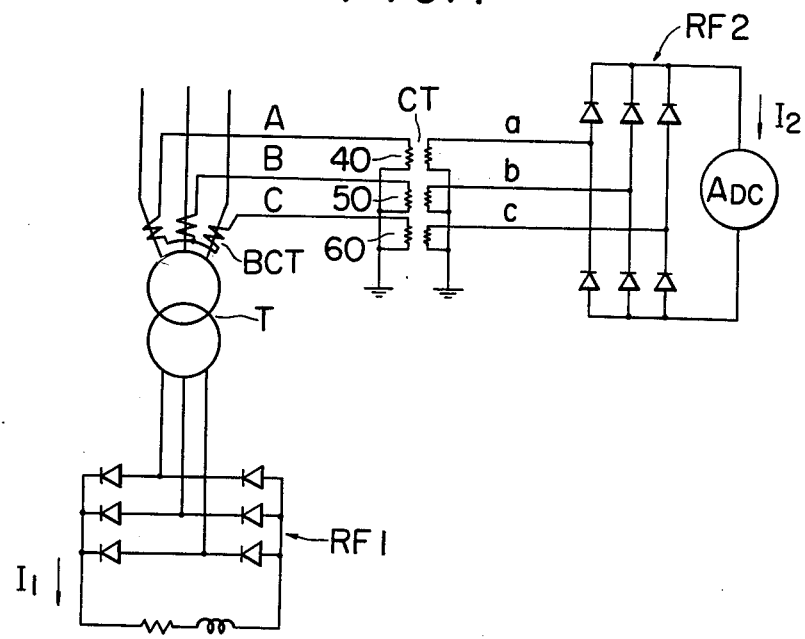
FIG. 1 is a connection diagram showing a prior art measuring device utilized for indirectly measuring the output current of a polyphase rectifier device.
Figure 2:
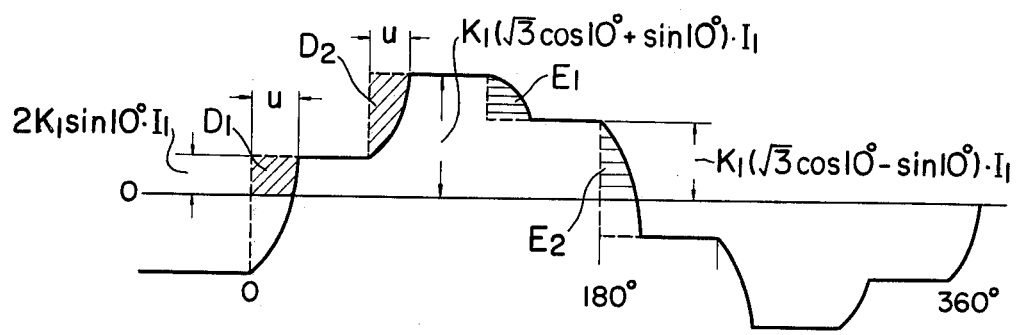
FIG. 2 is a graph showing the output current characteristic of a current transformer utilized in FIG. 1.
Figure 3:
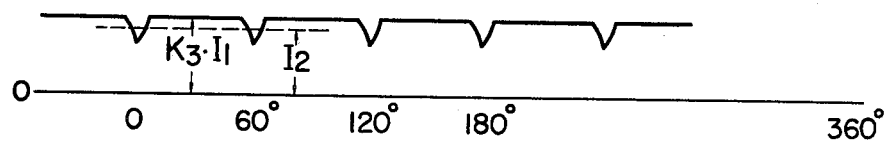
FIG. 3 is a graph showing the characteristic of the measuring current in the measuring circuit shown in FIG. 1.
Figure 4:
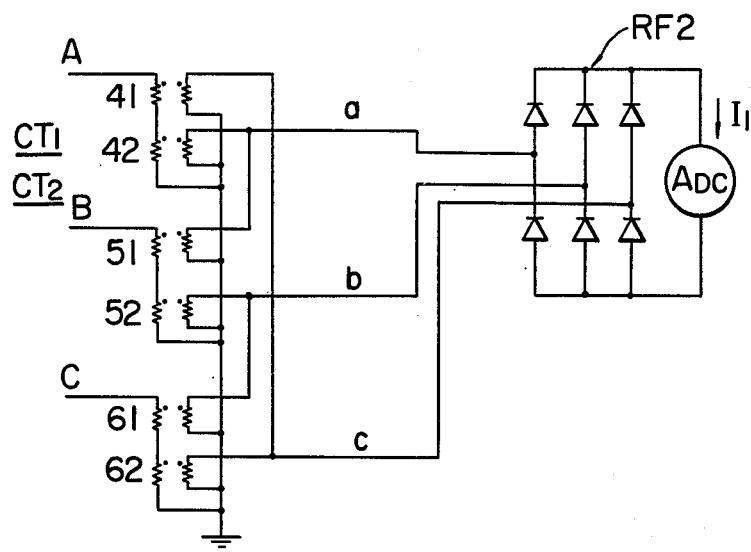
FIG. 4 is a connection diagram showing the AC measuring circuit embodying the invention.
Figure 5:
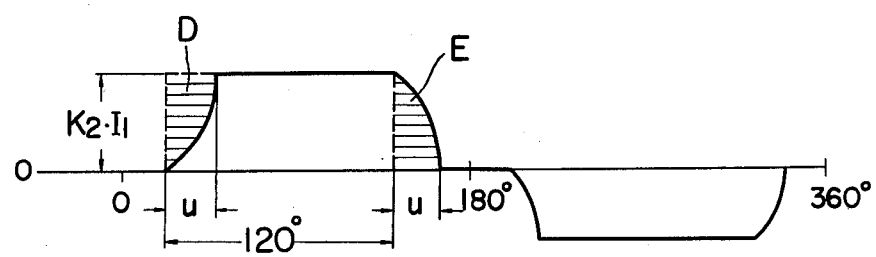
FIG. 5 shows the result and output current of the current transformers utilized in the embodiment shown in FIG. 4.
Figures 6, 7:
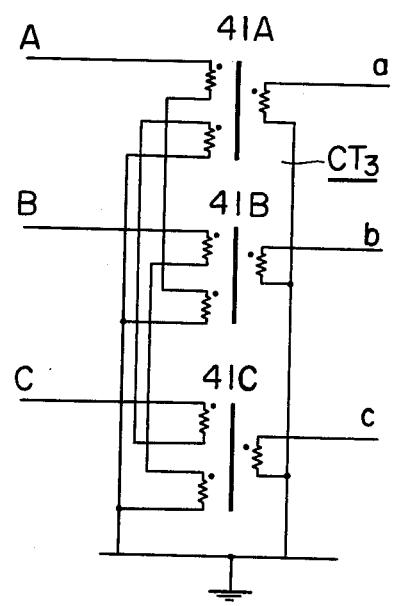
FIG. 6 is a graph showing the measuring current.
FIG. 7 is a connection diagram showing the AC measuring circuit of a modified embodiment of this invention.

Referring now to FIG. 4 which shows one example of the AC measuring circuit of this invention, two auxiliary current transformers $CT_1$ and $CT_2$, each having polyphase primary windings 41, 51, 61 and 42, 52 and 62 are connected in series with output lines A, B and C from the bushing current transformers shown in FIG. 1. The resultant three phase secondary output of the auxiliary current transformers $CT_1$ and $CT_2$ is rectified by a measuring rectifier $RF_2$ and its output current $I_2$ is measured by a DC ammeter $A_{DC}$. The primary windings of each phase of the auxiliary current transformers are connected in series whereas the secondary windings are connected such that the resultant current of the secondary windings of phase B of the auxiliary current transformer $CT_1$ and phase A of the auxiliary current transformer $CT_2$ will flow through conductor a, that the resultant current of the secondary windings of phase C of the auxiliary current transformer $CT_1$ and phase B of the auxiliary current transformer $CT_2$ will flow through conductor b and that the resultant current of the secondary windings of phase A of the auxiliary current transformer $CT_1$ and phase C of the auxiliary current transformer $CT_2$ will flow through conductor c. The current ratios of the auxiliary current transformers $CT_1$ and $CT_2$ are set such that the step shaped current flowing through primary conductors A, B and C and shown in FIG. 2 will induce secondary current which flows through secondary conductors a, b and c with a waveform as shown in FIG. 5 wherein area D of the decreasing current wave is equal to the area E of the increasing current wave E during commutation. FIG. 2 shows the waveform and instantaneous values of the current flowing through one of primary conductors A, B and C when the rectifier transformer T shown in FIG. 1 comprises delta connected primary windings, phase shift windings for shifting the phase by −10°, and delta connected secondary windings. With the waveform shown, as the sum of areas $D_1+D_2$ of the decreasing current wave due to the overlap angle u is larger than the sum of areas $E_1+E_2$ of the increasing current wave, when such alternating current is rectified by the measuring rectifier $RF_2$ by the prior art AC measuring method described above, the resulting direct current drops at an interval of 60° as shown in FIG. 3. Accordingly, when this output current is measured by DC ammeter $A_{DC}$ it indicates a value $I_2$ which is smaller than the proportional value $K_3 \cdot I_2$ of the output current $I_1$ of the main rectifier $RF_1$. According to this invention, however, since auxiliary current transformers $CT_1$ and $CT_2$ are combined to correct the waveform of the primary current of these auxiliary current transformers such that the area D of the decreasing current wave will be equal to the area E of the increasing current wave as shown in FIG. 5, the output $I_2$ of the measuring rectifier is a flat direct current exactly proportional to the output $I_1$ of the main rectifier as shown in FIG. 6, thus producing correct measuring current $I_2$ not affected by the overlap angle u of the rectifier transformer T. Such flat current can readily be displayed by a conventional DC ammeter. Where $-10°$ phase shift windings are provided for the primary side of the rectifying transformer it is advantageous to set the current ratios of auxiliary transformers $CT_1$ and $CT_2$ to be 1:0.2005 and 1:1.0851 respectively.

Although in the foregoing embodiment secondary windings of two auxiliary current transformers $CT_1$ and $CT_2$ were combined to obtain a composite secondary current having a waveform as shown in FIG. 5, in a modified embodiment shown in FIG. 7 an auxiliary current transformer $CT_3$ having three cores 41A, 41B and 41C each would with two primary windings and one secondary winding is provided and the primary windings are combined to obtain the desired secondary current.

As above described, according to the apparatus of this invention it is possible to accurately measure the output direct current of a rectifier by an indirect method without being affected by the overlap angle of the rectifier.

We claim:

1. In an apparatus for measuring the output DC current of a polyphase rectifier device of the type wherein the output DC current is indirectly measured on the input side of a polyphase rectifier transformer provided with phase shift windings, said output DC current being measured through a current transformer means and a measuring rectifier, the improvement in said current transformer means comprising a first and a second three-phase auxiliary current transformer means having three-phase primary windings of the same phases respectively connected in series with each other, and having secondary windings connected such that the resultant current of the secondary winding of a second phase of said first auxiliary current transformer means and the resultant current of the secondary winding of a first phase of said second auxiliary current transformer means flow through a first conductor of a three phase system, that the resultant current of the secondary winding of a third phase of said first auxiliary current transformer means and the resultant current of the secondary winding of a second phase of said second auxiliary transformer means flow through a second conductor of said three phase system, and that the resultant current of the secondary winding of a first phase of said first auxiliary current transformer means and the resultant current of the secondary winding of a third phase of said second auxiliary transformer means flow through a third conductor of said three phase system, the three phase secondary output current of said first and second auxiliary current transformer means on said first, second and third conductors being rectified by said measuring rectifier, and the current ratios of said first and second auxiliary current transformer means being set such that the currents induced in said secondary windings and flowing through the first, second and third conductors have a waveform wherein the area of a decreasing current wave is equal to the area of an increasing current wave during commutation.

2. The apparatus set forth in claim 1 further comprising a DC ammeter connected to measure the output of said measuring rectifier.

* * * * *